(12) United States Patent
Ochi et al.

(10) Patent No.: US 8,828,280 B2
(45) Date of Patent: Sep. 9, 2014

(54) PASTE COMPOSITION FOR SOLAR CELL, MANUFACTURING METHOD THEREFOR AND SOLAR CELL

(75) Inventors: Kosuke Ochi, Nagoya (JP); Shinji Senda, Nagoya (JP); Masao Yamagishi, Nagoya (JP); Mamiko Kume, Nagoya (JP)

(73) Assignee: Noritake Co., Ltd, Aichi (JP)

( * ) Notice: Subject to any disclaimer, the term of this patent is extended or adjusted under 35 U.S.C. 154(b) by 464 days.

(21) Appl. No.: 12/974,257

(22) Filed: Dec. 21, 2010

(65) Prior Publication Data

US 2011/0155967 A1 Jun. 30, 2011

(30) Foreign Application Priority Data

Dec. 28, 2009 (JP) ................. 2009-297944

(51) Int. Cl.
| | | |
|---|---|---|
| H01B 1/02 | (2006.01) | |
| H01B 1/06 | (2006.01) | |
| H01B 1/22 | (2006.01) | |
| C01B 33/02 | (2006.01) | |
| C01B 13/00 | (2006.01) | |
| C01C 1/00 | (2006.01) | |
| C01D 1/02 | (2006.01) | |
| C01G 23/00 | (2006.01) | |
| C01G 9/02 | (2006.01) | |
| C01G 11/02 | (2006.01) | |
| C01G 13/02 | (2006.01) | |
| H01M 4/02 | (2006.01) | |
| H01M 4/13 | (2010.01) | |
| H01L 31/00 | (2006.01) | |
| H01L 31/0224 | (2006.01) | |
| H01B 1/16 | (2006.01) | |

(52) U.S. Cl.
CPC . H01B 1/16 (2013.01); Y02E 10/50 (2013.01); H01L 31/022425 (2013.01)
USPC ............ 252/519.54; 252/512; 252/519.12; 252/519.5; 252/520.2; 252/520.22; 252/521.3; 423/326; 423/349; 423/593.1; 423/598; 423/594.14; 429/209; 136/252

(58) Field of Classification Search
USPC ...................................... 252/500
See application file for complete search history.

(56) References Cited

U.S. PATENT DOCUMENTS

| | | | |
|---|---|---|---|
| 6,548,168 B1 * | 4/2003 | Mulvaney et al. | 428/402 |
| 2004/0003836 A1 | 1/2004 | Watsuji et al. | |
| 2004/0055635 A1 | 3/2004 | Nagakubo et al. | |
| 2006/0231804 A1 * | 10/2006 | Wang et al. | 252/500 |
| 2006/0289055 A1 | 12/2006 | Sridharan et al. | |
| 2007/0079868 A1 | 4/2007 | Rose et al. | |
| 2009/0229665 A1 | 9/2009 | Young et al. | |
| 2009/0301553 A1 * | 12/2009 | Konno et al. | 136/252 |

FOREIGN PATENT DOCUMENTS

| | | | |
|---|---|---|---|
| CN | 1873836 | 12/2006 | |
| JP | 2002-087817 | 3/2002 | |
| JP | 2004-134775 | 4/2004 | |
| JP | 2004-292282 | 10/2004 | |
| JP | 2005163142 A * | 6/2005 | B22F 1/02 |
| JP | 2005-243500 | 9/2005 | |
| JP | 3910072 | 2/2007 | |
| JP | 2007-128872 | 5/2007 | |
| JP | 2007-273781 | 10/2007 | |
| JP | 2008-112808 | 5/2008 | |
| JP | 2008-543080 A | 11/2008 | |
| JP | 2011-521401 | 7/2011 | |

OTHER PUBLICATIONS

Tani et al. Synthesis of zinc oxide/silica composite nanoparticles by flame spray pyrolysis. Journal of Materials Science 37 (2002) 4627-4632.*
Notice of Allowance for Japanese Application No. 2009-297944 dated Mar. 29, 2012.
Notification of the First Office Action for Chinese Patent Application No. 201010623387.8 Dated Feb. 8, 2014, 14 pgs.

* cited by examiner

*Primary Examiner* — Harold Pyon
*Assistant Examiner* — Tanisha Diggs
(74) *Attorney, Agent, or Firm* — Amin, Turocy & Watson, LLP

(57) ABSTRACT

The paste composition for forming a back electrode of solar cell 10 provided by the present invention contains, as solids, an aluminum powder, a glass powder and a composite powder composed of a particulate composite of a metal oxide with a silicon-containing organic or inorganic compound. This composite powder is contained in an amount of at least 0.01 mass % but less than 0.45 mass % given 100 mass % as the total of the composite powder, the aluminum powder and the glass powder.

11 Claims, 1 Drawing Sheet

Prior Art

PASTE COMPOSITION FOR SOLAR CELL, MANUFACTURING METHOD THEREFOR AND SOLAR CELL

BACKGROUND OF THE INVENTION

1. Field of the Invention

The present invention relates to a paste composition for a solar cell, and to a manufacturing method therefor. Specifically, it relates to an aluminum-containing paste composition for forming an aluminum electrode (as a back electrode) on the back side of the light-receiving surface of crystal silicon solar cell, and to a manufacturing method therefor.

The priority claim for the present application is based on Japanese Patent Application No. 2009-297944 submitted on Dec. 28, 2009, and the entire contents of that application are incorporated by reference in this Description.

2. Description of the Related Art

A typical example of solar cell for converting the light energy of the sun into electricity is the so-called crystal silicon solar cell, a solar cell that uses crystalline (single-crystal or multi-crystal) silicon for the semiconductor substrate. An example of such a crystal silicon solar cell is the monofacial type of solar cell 110 shown in FIG. 2.

This solar cell 110 has n-Si layer 116 formed by pn junction formation on the light-receiving surface of the p-Si layer (p-type crystal silicon) 118 of silicon substrate (Si wafer) 111, antireflective film 114 of titanium oxide or silicon nitride formed by CVD or the like on the surface of layer 116, and front electrode (light-receiving surface electrode) 112 made of Ag formed typically by screen printing and firing a silver paste. Meanwhile, the back side of p-Si layer 118 is provided with back external connection electrode 122 made of Ag formed like front electrode 112 by screen printing and firing a silver paste, and aluminum electrode 120 providing a back surface field (BSF) effect.

This aluminum electrode 120 is formed over roughly the entire back surface by printing and firing an aluminum paste consisting mainly of aluminum powder. An Al—Si alloy layer (not shown) is formed during firing, and the aluminum diffuses into p-Si layer 118, forming p$^+$ layer 124. Formation of this p$^+$ layer 124, or in other words of a BSF layer, serves to prevent the photogenerated carrier from recombining near the back electrode, thereby improving the short-circuit current and open voltage (Voc) for example.

However, aluminum electrode 120 must be formed with a certain thickness (such as 30 to 60 µm) in order for this BSF effect to operate effectively. At the same time, silicon substrate (Si wafer) 111 and in fact the solar cell element itself are being required to be even thinner than before so that solar cell manufacturing costs can be reduced and solar cell modules made more compact.

Because of the difference between the thermal expansion coefficient of substrate 111 itself and the thermal expansion coefficient of aluminum electrode 120, however, making the substrate (Si wafer) thinner contributes to problems of warpage, curling and other deformation of the silicon substrate (wafer) 111 itself during firing to form aluminum electrode 120. Various measures have been taken in the past to prevent such warpage and other deformation.

For example, Japanese Patent No. 3910072 proposes an aluminum-containing paste composition for forming an impurity layer or electrode layer on a p-type silicon semiconductor substrate, which is a paste composition containing silicon oxide or aluminum oxide. Japanese Patent Application Laid-open No. 2008-112808 proposes a solar cell element provided with a sintered electrode consisting primarily of aluminum on a p-type silicon substrate, wherein the sintered electrode contains particles of a zinc oxide aggregate. Japanese Translation of PCT Application No. 2008-543080 (corresponding to WO 2006/132766), which does not pertain directly to the present application, proposes a paste composition for forming a solar cell contact (herein called a front electrode or back electrode), which is a paste composition containing a lead- and cadmium-free glass component.

SUMMARY OF THE INVENTION

However, although some improvement in the aforementioned problems of prior art (that is, warpage and curling of the substrate during firing of the aluminum electrode) can be can be obtained by applying the techniques (aluminum-containing paste compositions) described in these patent documents, warpage has still not been resolved sufficiently to provide significant improvement in yields and line tact (for example, the warpage has not been reduced by ten times or less the thickness of the substrate, and there is room for further improvement. Conventionally, moreover, there is the risk of blemishes occurring on the back electrode after firing of the substrate, creating problems of external appearance that need to be resolved. However, it has been difficult to control such blemishes with the techniques disclosed in the aforementioned patent documents.

In light of these facts, it is an object of the present invention to prevent warpage and other deformation of the substrate and provide a paste composition for forming a film-shaped aluminum electrode having a good external appearance. Another object is to provide a method for manufacturing this paste composition. Another object is to provide a solar cell equipped with a back electrode formed using this paste composition.

To achieve these objects, the paste composition provided by the present invention is a paste composition for forming a back electrode of a solar cell. This paste composition contains, as solids, an aluminum powder, a glass powder, and a composite powder composed of a particulate composite of a metal oxide with a silicon-containing organic or inorganic compound. The composite powder is contained in an amount of at least 0.01 mass % but less than 0.45 mass % given 100 mass % as the total of the composite powder, the aluminum powder and the glass powder.

When this composite powder is contained at this rate in the paste composition of the present invention, warpage of the substrate is effectively controlled when the paste composition is applied to a substrate (such as an Si substrate) and fired to form a back electrode, and blisters and other blemishes on the back electrode are also well controlled. Despite the inclusion of this composite powder, moreover, the battery characteristics (for example open voltage Voc) of a solar cell provided with a back electrode (film) obtained using this paste composition can be maintained at a high level.

Consequently, with the paste composition for forming a back electrode of the present invention it is possible to not only prevent warpage of the substrate but also to obtain a solar cell with excellent battery characteristics and a good external appearance.

In a preferred aspect of the paste composition disclosed here, the composite powder is the aforementioned metal oxide at least part of the surface of which is coated with the aforementioned silicon-containing organic or inorganic compound.

With a paste composition containing such a composite powder composed of a composite (particles) of this sort, a solar cell can be achieved with a greater substrate warpage-prevention effect, a greater blemish suppression effect and more improved battery characteristics such as those described above.

In a more preferred aspect of the paste composition disclosed here, the metal oxide is a titanium or zinc oxide.

With a paste composition containing a composite powder using such a metal oxide, it is possible to achieve a solar cell exhibiting the aforementioned effects to a still greater degree.

In another preferred aspect of the paste composition disclosed here, an average particle diameter of the aforementioned composite powder is at least 1 nm but no more than 100 nm.

With a paste composition containing a composite powder composed of particles of this size, it is possible to control the occurrence of blemishes while forming a dense back electrode capable of maintaining high conductivity, and to achieve a superior solar cell having good battery characteristics.

In another preferred aspect of the paste composition disclosed here, the proportion of the aforementioned solids is at least 60 mass % but no more than 80 mass % of the total paste composition.

A paste composition containing this proportion of solids is easy to apply uniformly to the substrate (typically a film substrate), and a back electrode (film) with a good appearance can be formed on a substrate by firing a substrate to which this paste composition has been applied.

Consequently, with the present invention it is possible to favorably achieve a solar cell providing effects such as those described above by forming a back electrode using any one of the paste compositions disclosed here.

Another aspect of the present invention provides a method for manufacturing a paste composition for the back electrode of a solar cell. This method includes preparing, as solids, an aluminum powder, a glass powder and a composite powder composed of a particulate composite of a metal oxide with a silicon-containing organic or inorganic compound, and mixing the prepared powders with a liquid medium to prepare a paste. In this method, the composite powder is mixed in an amount of at least 0.01 mass % but less than 0.45 mass % given 100 mass % as the total of the composite powder, the aluminum powder and the glass powder.

Using the manufacturing method of the present invention, a paste composition for forming a back electrode can be provided whereby warpage of the substrate can be prevented and blemishes suppressed to achieve a solar cell with a good external appearance and excellent battery characteristics (such as high open voltage).

In a preferred aspect of the manufacturing method disclosed here, the aforementioned metal oxide at least part of the surface of which is coated with the aforementioned silicon-containing organic or inorganic compound is used as the aforementioned composite powder.

With the manufacturing method of this configuration using a composite powder composed of a composite (particles) of this type, a paste composition for forming a back electrode can be provided capable of yielding a solar cell with a still greater substrate warpage prevention effect and blemish suppression effect and more improved battery characteristics.

In a more preferred aspect of the manufacturing method disclosed here, an titanium or zinc oxide is used as the metal oxide.

With the manufacturing method of this configuration, a paste composition for forming a back electrode is provided capable of yielding a solar cell exhibiting the aforementioned effects to a still greater degree.

In another preferred aspect of the manufacturing method disclosed here, when preparing the aforementioned paste, the composite powder is provided in the form of a dispersion in which the powder is dispersed in advance in a specific liquid medium.

With the manufacturing method of this configuration, a still better paste composition containing the aforementioned composite powder in a more dispersible state is provided by using the composite powder in the form of a pre-prepared (or compounded) dispersion.

In a preferred aspect of the manufacturing method disclosed here, the composite powder used is a composite powder with an average particle diameter of at least 1 nm but no more than 100 nm.

With the manufacturing method of this configuration, a paste composition for forming a back electrode is provided capable of controlling the occurrence of blemishes and yielding a superior solar cell provided with a dense back electrode that maintains high conductivity.

DESCRIPTION OF THE PREFERRED EMBODIMENTS

Figure 1:
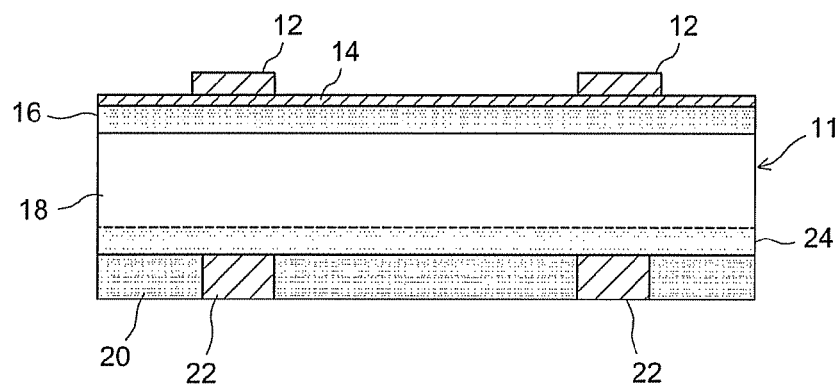
FIG. 1 is a cross-section showing one example of the structure of a solar cell provided with an aluminum electrode formed with the paste composition disclosed here.

Preferred embodiments of the present invention are explained below. Matters not specifically addressed in this Description that are necessary for implementing the present invention (such as the method of mixing the raw material powder (solids) and liquid medium of the paste composition, the method of applying the paste composition to the substrate and the like) can be understood by a person skilled in the art as design matters based on prior art in the field. The present invention can be implemented based on the content disclosed in this Description and on technical common knowledge in the field.

The paste composition disclosed here is a paste composition for forming a back electrode, to be used for the purpose of forming an aluminum electrode as the back electrode of a solar cell. The characteristic feature of this paste composition is that it contains, as solids, an aluminum powder, a glass powder, and a composite powder composed of a particulate composite of a metal oxide with a silicon-containing organic or inorganic compound, with the composite powder being contained in the amount of at least 0.01 mass % but less than 0.45 mass % given 100 mass % as the total of the composite powder, the aluminum powder and the glass powder. Consequently, other components and compounded amounts (rates) thereof are not particularly limited as long as the object of the present invention is achieved.

The aluminum powder contained as the principal solid component in the paste composition disclosed here is an aggregate of particles consisting primarily of aluminum (Al), and typically an aggregate of particles consisting solely of Al. However, "aluminum powder" in this sense encompasses composites of particles consisting primarily of Al as a whole even if the aluminum powder also contains trace quantities of impurities other than Al or alloys (particles) consisting primarily of Al. This aluminum powder may be one manufactured by well-known conventional manufacturing methods, and does not require any special manufacturing process.

The form of the particles making up this aluminum powder is not particularly limited. They are typically spherical, but do not need to be true spheres. Possible forms other than spheres include flakes and irregular forms. The aluminum powder may also be composed of particles having a variety of such forms. When the aluminum powder is composed of particles with a small average particle diameter (such as a few μm), it is desirable that at least 70 mass % of the particles (primarily particles) have a spherical or similar form. For example, it is desirable that at least 70 mass % of the particles making up the aluminum powder have an aspect ratio (that is, the ratio of the long axis of the particle to the short axis) of 1 to 1.5.

When forming an aluminum electrode as a back electrode on one side (typically the back side of the light-receiving surface) of the substrate (such as a Si substrate) of a solar cell, the film thickness of the dried coat before firing (that is, of the dried aluminum film) is preferably 100 μm or less or more preferably 80 μm or less or still more preferably 60 μm or less, such as 40 μm±10 μm.

A preferred aluminum powder for forming a dried coat with such a film thickness is one in which the average particle size of the particles making up the powder is 20 μm or less or preferably at least 1 μm but no more than 10 μm or still more preferably at least 2 μm but no more than 8 μm, such as 5 μm±1 μm. The average particle diameter here is the diameter at 50% accumulated volume in the particle size distribution of the powder, or in other words the D50 (median diameter). This D50 value can be easily measured with a particle size analyzer based on laser analysis methods (in which the particle size distribution is determined from the scattering pattern of laser light scattered from a measurement sample).

For example, it is possible to use a (mixed) aluminum powder composed of multiple (typically 2) aluminum powders with different ranges of average particle diameter (ranging from 3 μm to 7 μm for example) mixed together so that the average particle diameter of the mixed powder is within the aforementioned range. A dense aluminum electrode suitable as a back electrode can be formed by using an aluminum powder with such an average particle size.

The content of this aluminum powder in the paste composition disclosed here is not particularly limited, but the content is preferably adjusted so that the aluminum powder constitutes at least 60 mass % but no more than 80 mass % (or more preferably at least 65 mass % but no more than 80 mass %, such as at least 70 mass % but no more than 80 mass %) given 100 mass % as the total of the paste composition. When the aluminum powder content of the manufactured paste composition is within this range, it is possible to form an aluminum electrode (film) with still greater density.

The glass powder (typically glass frit) contained as a subsidiary component in the solids of the paste composition disclosed here is an inorganic additive for improving the adhesive strength of the aluminum electrode as the back electrode of a solar cell with the constituent substrate. This glass powder preferably has a relatively high thermal expansion coefficient approaching the thermal expansion coefficient of aluminum. Examples of such glass include zinc glass (that is, glass consisting primarily of zinc), borosilicate glass (that is, glass consisting primarily of borosilicate), alkali glass (glass consisting primarily of an alkali metal oxide), glass containing barium oxide, bismuth oxide and the like, and mixtures of two or more of these. Preferred examples are glasses consisting primarily of the following oxides: $B_2O_3$—$SiO_2$—ZnO glass (glass consisting primarily of $B_2O_3$, $SiO_2$ and ZnO), $R_2O$—ZnO—$SiO_2$—$B_2O_3$ glass (glass consisting primarily of $R_2O$, ZnO, $SiO_2$ and $B_2O_3$, with $R_2O$ being an alkali metal oxide), $R^1O$—ZnO—$SiO_2$—$B_2O_3$ glass (glass consisting primarily of $R^1O$, ZnO, $SiO_2$ and $B_2O_3$, with $R^1O$ being an alkali earth metal oxide), $Bi_2O_3$—$B_2O_3$—ZnO glass (glass consisting primarily of $Bi_2O_3$, $B_2O_3$ and ZnO), $B_2O_3$—$SiO_2$—$Bi_2O_3$ glass (glass consisting primarily of $B_2O_3$, $SiO_2$ and $Bi_2O_3$) and the like. For purposes of stably firing and fixing (burning on) a paste composition (coat) applied to a substrate (such as an Si substrate), it is desirable that the glass frit contained in the paste composition have a specific surface area of roughly at least $0.5\,m^2/g$ but no more than $50\,m^2/g$, and an average particle diameter of 2 μm or less (especially about 1 μm or less).

The content of this glass powder in the paste composition is not particularly limited, but an amount equal to at least 0.5 mass % but no more than 5 mass % (preferably at least 0.5 mass % but no more than 3 mass %, or more preferably at least 1 mass % but no more than 3 mass %) of the paste composition as a whole is suitable.

The composite powder, which is a feature of the paste composition disclosed here, is explained next.

This composite powder is a component contained as a solid in the paste composition together with the aforementioned aluminum powder and glass powder. This composite powder is composed of a particulate composite of a metal oxide with a silicon-containing organic or inorganic compound (that is, it is an aggregate of this particulate composite).

This particulate composite is preferably the metal oxide particles at least part of the surface of which is coated with the silicon-containing organic or inorganic compound. This composite may have the silicon-containing organic or inorganic compound coated on the surface of primary particles of the metal oxide or on the surface of secondary particles (aggregates of two or more primarily particles) of the metal oxide, without any particular limitations, but considering that the aluminum particles in the paste composition adjoin each other with these composite particles in between, the compound is preferably coated on the surface of the primary particles. The average particle diameter of the composite particles making up this composite powder can be at least 1 nm but no more than 100 nm, or preferably at least 1 nm but no more than 80 nm, or more preferably at least 5 nm but no more than 70 nm. For example, when the metal oxide is titanium dioxide as discussed below, powder with an average particle diameter of at least 1 nm but no more than 20 nm can be used favorably. When the metal oxide is zinc oxide as discussed, below, it is desirable to use a powder with an average particle diameter of at least 10 nm but no more than 70 nm.

Desirable examples of the metal oxide in the composite include titanium and zinc oxide (that is, titanium dioxide ($TiO_2$) or zinc oxide (ZnO)). For the titanium dioxide, it is possible to use fine particles manufactured by conventional methods, such as fine particles manufactured by the so-called sulfate process, in which a titanium sulfate solution is hydrolyzed to obtain a hydrated titanium dioxide solution, which is then fired, or by the so-called chloride process, in which halogenated titanium is subjected to gas-phase oxidation. It is also possible to use a colloid (sol) containing fine particles of titanium dioxide obtained by the sol-gel method using titanium tetraisopropoxide (TTIP) as the starting material. The crystal form of the titanium dioxide obtained in this way may be anatase or rutile, and a mixture of anatase titanium dioxide and rutile titanium dioxide is also possible.

For the zinc oxide particles, it is possible to use fine particles obtained by a conventional method such as a dry method of heating metal zinc to vaporize it and then oxidizing it by burning in atmosphere (the so-called French method), or a wet method of adding an anhydrous salt of sodium carbonate (soda ash) to an aqueous solution of zinc sulfate or zinc chloride, and baking the resulting basic zinc carbonate (the so-called German method) or the like.

The aforementioned silicon-containing organic or inorganic compound (which may be referred to generally below as a "silicon-containing compound) may already be coated as silicon dioxide ($SiO_2$) on the surface of the metal oxide in the aforementioned composite, or may be a compound that ultimately becomes $SiO_2$ by oxidation (of at least part and typically most of the silicon-containing compound coated on the surface) when the paste composition is fired to form the aluminum electrode. This silicon-containing compound is preferably one that enables the composite to decompose at a temperature lower than the melting point (660° C.) of aluminum (such as at least 250° C. but no more than 600° C.). When the paste composition containing the composite is fired to form the aluminum electrode, there is a danger that coarse composite particles that may be locally present in the paste may react abnormally with the aluminum to produce blemishes around composite nuclei. When the composite has a decomposition temperature such as that described above, however, the composite is able to easily break down before any abnormal reaction can occur with the aluminum, thereby preventing the occurrence of blemishes by preventing the formation of nuclei for blemishes, and allowing an aluminum electrode to be formed with no blemishes and a good external appearance.

A composite powder composed of metal oxide particles the surface of which is coated with such a silicon-containing compound can be obtained by the following methods for example. In one method, metal oxide fine particles and a silicon-containing compound such as those described above are wet pulverized (or wet ground) together with a specific liquid medium in an agitating mill (medium agitating mill) or the like, and then dried to remove the liquid medium. Another possible method is one in which the metal oxide powder is simultaneously agitated and sprayed with the silicon-containing compound (typically prepared as a solution), which has been atomized with an air sprayer or the like. The silicon-containing compound used in this method is an organic silicon compound such as an organic silane compound or especially an alkoxysilane, and specific examples include methyltrimethoxysilane, dimethyldimethoxysilane, methyltriethoxysilane, dimethyldiethoxysilane, n-propyltrimethoxysilane, isobutyltrimethoxysilane, hexyltrimethoxysilane, hexyltriethoxysilane, octyltriethoxysilane, decyltrimethoxysilane and the like. A variety of silane coupling agents can also be used as organic silicon compounds. Another example of a method for manufacturing the composite powder is to add the silicon-containing compound at a specific (such as alkaline) pH to a dispersion (or slurry) of the metal oxide powder (particles) dispersed in water-based liquid solvent (water-based solvent), or to a water-based medium containing a gel of the metal oxide, and then neutralize the pH to precipitate the composite. When the composite is prepared by this method, it can be used in its un-neutralized, un-precipitated state (typically as a dispersion or slurry) when preparing the paste composition. This is efficient because the composite can be used in a state before it is made into a powder. The silicon-containing compound used in this method is preferably water soluble, and examples include alkali metal salts of silicic acid (alkali silicates) and silica sols. Examples of alkali silicates include alkali metal salts (typically sodium salts) of orthosilicic acid ($H_4SiO_4$), metasilicic acid ($H_2SiO_3$) and mesosilicic acid ($H_2SiO_5$), and typically an alkali metal salt of metasilicic acid can be used, especially liquid glass, which is a concentrated aqueous solution (typically a concentrated aqueous solution of sodium silicate ($Na_2O.SiO_2$)). A water-based medium containing the aforementioned dispersion or sol may also contain various additives for improving stability, dispersibility and the like in addition to the silicon-containing compound.

A composite powder manufactured by such methods is preferably contained in the paste composition in the amount of at least 0.01 mass % but less than 0.45 mass % given 100 mass % as the total of the composite powder, the aluminum powder and the glass powder (or in other words the mass of the solids in the paste composition disclosed here). Using a paste composition containing this proportion of composite powder, it is possible to form a back electrode (solar cell) with good open voltage (Voc) and other battery characteristics while avoiding substrate warpage and problems of external appearance caused by blemishes on the aluminum electrode and the like. For example, a solar cell equipped with this back electrode can provide open voltage of 610 mV or more. If the amount of the composite powder as a percentage of the solids is less than 0.01 mass %, it will have very little effect in terms of suppressing substrate warpage, and there will be no improvement in external appearance as described above. On the other hand, if the amount of the composite powder as a percentage of the solids is much greater than 0.45 mass %, the effect on substrate warpage and occurrence of blemishes will be much greater, but the open voltage may be lower, adversely affecting the battery characteristics. If the amount of the composite powder as a percentage of the solids is at least 0.1 mass % (but less than 0.45 mass %) on the other hand, substrate warpage will be reduced by 30% or more compared with when no composite powder is added or when a metal oxide (such as titanium dioxide) is added in place of the composite powder. A percentage of at least 0.3 mass % (but less than 0.45 mass %) is still more desirable, since substrate warpage is reduced by 40% or more.

The composite powder may be used as is in powder form when mixing the composite powder with the other components (ingredients) to prepare the paste composition, but it can also be provided in the form of a dispersion or slurry composition (hereunder sometimes called simply a slurry) composed of the composite powder pre-dispersed in a specific liquid medium. When the composite powder in the form of such a dispersion or slurry is mixed with the other components, the composite particles making up the composite powder are dispersed more easily and uniformly in the mixture (or in other words in the paste composition) than when they are mixed in powder form. It is thus possible to obtain a good paste composition providing still greater effects in terms suppressing substrate warpage and blemishes on the aluminum electrode. The liquid medium for dispersing the composite powder to form a dispersion or slurry is preferably one that allows the silicon-containing compound coating the metal oxide in the composite particles to remain stable without reacting (decomposing for example) in the dispersion or slurry, one in which the composite particles can disperse properly (uniformly in other words), and one having good affinity (compatibility) with the liquid medium (such as the vehicle described below) used to disperse the solids (powders) contained in the paste composition. Examples of such liquid media include water-based solvents (which may be adjusted to a specific pH for example), and ethanol, propanol, isopropyl alcohol and other alcohols. Other examples include ethylene glycol and diethylene glycol derivatives (glycol ether solvents), toluene, xylene, butyl carbitol (BC), terpineol and the like, which are high-boiling-point organic solvents that can be used as organic solvents in the aforementioned vehicle. The content of the composite power in a dispersion or slurry of the composite powder dissolved in such a liquid medium is not particularly limited but can be at least 10 mass % but no more than 30 mass % (preferably at least 10 mass % but no more than 20 mass %) of the dispersion (or slurry) as a whole for example. A dispersion or slurry consisting mainly of the composite powder can also contain various additives (such as dispersants for improving the dispersibility of the composite powder) as accessory components.

The paste composition disclosed here contains aluminum powder, glass powder and composite powder such as those mentioned above as solids as well as a liquid medium for dispersing these solids. The proportion of the solids in the paste composition, or in other words the content of the solids in the paste composition, can be at least 50 mass % but no more than 90 mass %, or preferably at least 60 mass % but no more than 80 mass %, or more preferably at least 65 mass % but no more than 75 mass % given 100 mass % as the total of the paste composition including the solids and the liquid solvent. A paste composition containing this proportion of solids has the advantages of ease of handling, including ease of application (coating) as an aluminum electrode (film) on the substrate, and ease of drying without the need for a long drying time in the drying step before the aluminum electrode film is fired.

In the paste composition disclosed here, the liquid medium for dispersing the solids in the composition is typically an organic medium (vehicle). The organic solvent in this vehicle can be any capable of properly dispersing the solids (powders) and especially the aluminum powder, and those conventionally used in this kind of paste can be used without any particular limitations. For example, a high-boiling-point organic solvent such as an ethylene glycol or diethylene glycol derivative (glycol ether solvent), toluene, xylene, butyl carbitol (BC), terpineol or the like or a combination of multiple such solvents can be used as the solvent in the vehicle.

Various resin components can also be included as organic binders in this vehicle. These resin components can be any capable of giving the paste composition good viscosity and coating properties (adhesiveness with the substrate), and those conventionally used in this kind of paste can be used without any particular limitations. Examples include those composed primarily of acrylic resin, epoxy resin, phenol resin, alkyd resin, cellulose polymers, polyvinyl alcohol, rosin and the like. Of these, a cellulose polymer such as ethyl cellulose is especially preferred. The content of the organic vehicle is not particularly limited but can be at least 10 mass % but no more than 50 mass % of the paste composition as a whole, or preferably at least 20 mass % but no more than 40 mass %, or more preferably at least 25 mass % but no more than 35 mass %. The organic binder contained in this organic vehicle is preferably contained in the amount of at least 1 mass % but no more than 5 mass % (more preferably at least 1 mass % but no more than 3 mass %) of the paste composition as a whole.

Like a conventional aluminum paste for a solar cell, the paste composition disclosed here can be easily prepared by typically mixing the aluminum powder, glass powder, composite powder and organic vehicle. For example, the aluminum powder, glass powder and composite powder in specific proportions can be mixed and agitated together with the organic vehicle at a specific mixing ratio in a triple roll mill or other kneading device.

The paste composition disclosed here can be handled in the same way as the conventional aluminum paste used to form aluminum electrode 20 (and thus the $p^+$ layer or in other words BSF layer 24) as the back electrode of substrate (typically silicon substrate) 11 of solar cell 10 as shown in FIG. 1, using conventional well-known methods without any particular limitations. Typically, the paste composition is applied to (coated on) the substrate by screen printing, dispenser coating, dip coating or the like so as to obtain the desired film thickness (such as 30 μm or less as described above) or coat pattern. The substrate is preferably a silicon (Si) substrate, typically a Si wafer. The thickness of this substrate can be set according to the size of the desired solar cell, the film thickness of the aluminum electrode to be formed on the substrate, the strength (such as breaking strength) of the substrate and the like, but can suitably be at least 100 μm but no more than 300 μm, or preferably at least 150 μm but no more than 250 μm, such as at least 180 μm but no more than 220 μm.

Figure 2:
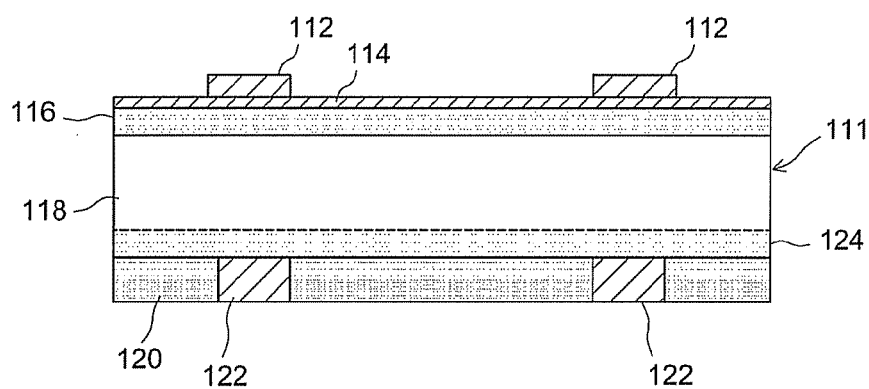
FIG. 2 is a cross-section showing one example of a conventional solar cell.

Next, the paste coat is dried at a suitable temperature (such as room temperature or more, or typically about 100° C.). After being dried, it is heated for a specific time in a suitable firing furnace (such as a high-speed firing furnace) at a suitable temperature (such as at least 600° C. but no more than 900° C., or preferably at least 700° C. but no more than 800° C.) to fire the dried coat. In this way, the paste coat is fired onto substrate 11, forming aluminum electrode 20 as shown in FIG. 1. Normally, $p^+$ layer (BSF layer) 24 can be formed as discussed above as aluminum electrode 20 is fired. That is, as aluminum electrode 20 is formed as the back electrode on substrate 11 by the firing process, aluminum atoms diffuse into substrate 11 (specifically, p-Si layer 18, which is the same as that shown in FIG. 2), forming $p^+$ layer 24 with aluminum as the impurity.

As discussed above, the paste composition disclosed here contains a composite powder composed of a particulate composite of a metal oxide with a silicon-containing organic or inorganic compound (silicon-containing compound). Because these composite particles intervene between the aluminum particles, they can suppress excessive aggregation and sintering between aluminum particles when the paste is applied to (coated on) a substrate and fired, thereby mitigating the difference in thermal expansion (contraction) between the substrate and the paste coat (aluminum electrode), and controlling or preventing warpage and other deformation of the substrate as well as the occurrence of blemishes on the aluminum electrode formed by the firing process. Moreover, in an aluminum electrode obtained using this paste composition, good conduction between aluminum particles can be maintained despite the presence of the composite particles. Therefore, a superior solar cell with good battery characteristics (such as high open voltage of 610 mV or more) can be achieved with this paste composition.

Apart from the formation of the aluminum electrode (back electrode) using the paste composition disclosed here, the materials and processes for solar cell manufacture may be exactly the same as in the past. A solar cell (typically a crystal silicon solar cell) provided with a back electrode formed with this paste composition can be manufactured without the need for any special processing. FIG. 1 shows a typical example of the configuration of such a crystal silicon solar cell (with the basic configuration being similar to that shown in FIG. 2). As a process following aluminum electrode formation, Ag electrodes (front electrode 12 and back external connection electrode 22 in FIG. 1) with specific patterns can be formed on the light-receiving side and back side by screen printing or the like using a conventional paste composition consisting primarily of silver (silver paste) for example. An $n^+$ layer (that is, n-Si layer 16 in FIG. 1) or antireflective film (antireflective film 14 in FIG. 1) can also be formed on the light-receiving side by a process similar to conventional processes.

Solar cell (element) 10 can be manufactured in this way. The manufacturing process for solar cell (element) 10 is not explained in detail because it is not a feature of the present invention and may be the same as prior art.

Examples of the present invention are explained below, but the intent is not to limit the present invention to what is shown in these examples.

Example 1

Preparation of Paste Compositions (1)

(1) Aluminum powder with an average particle diameter (D50) of 5 μm was provided as the aluminum powder.

(2) Glass frit composed of zinc ($B_2O_3$—$SiO_2$—ZnO) glass (with the composition $B_2O_3$: 36 mol %, $SiO_2$: 29 mol %, ZnO: 8 mol %, $Al_2O_3$: 4 mol %, SrO: 10 mol %, BaO: 13 mol %) was prepared as the glass powder.

(3) The composite powder was prepared by the following procedures.

1) Titanium tetrachloride was prepared and gas-phase oxidized to obtain titanium dioxide, which was then pulverized to obtain titanium dioxide ($TiO_2$) powder with a specific average particle diameter. The resulting titanium dioxide powder was then dispersed in water to prepare an aqueous slurry with a titanium dioxide concentration of 300 g/L. Next, a specific concentration of sodium hydroxide aqueous solution was added to this aqueous slurry to raise the pH of the slurry to 10.5, followed by 30 minutes of ultrasound dispersion. 4000 ml of the slurry was then heated with agitation to at least 70° C. but no more than 80° C., and 320 ml of an aqueous solution (150 g/l as $SiO_2$) of liquid glass (JIS K1408 liquid glass No. 3) diluted with water was added at this temperature. Agitation was then continued for about 30 minutes to achieve thorough mixing. This was then heated to a temperature of at least 90° C. but less than 100° C. so that it did not boil, and 2 mol/L of sulfuric acid was added over the course of 60 minutes at a rate of about 1 mL/minute to neutralize the pH to 5. This was then cured for 60 minutes with agitation with the temperature maintained at 70° C. The cured slurry was filtered and water washed, wet pulverized in a ball mill, and then dried under specific temperature conditions to obtain three kinds of composite powder with specific average particle diameters (6 nm, 30 nm and 70 nm), each made of $TiO_2$ and coated with a silicon-containing compound on the surface thereof.

2) Next, 16 g of the resulting composite powder was added together with 4 g of separately prepared isobutyl trimethoxysilane to 80 g of isopropyl alcohol, 250 g of 0.5 mm zirconia beads were added, and the mixture was dispersed for 240 minutes with a paint conditioner (Red Devil #511). The zirconia beads were then removed, and a dispersion or slurry composition (hereunder sometimes called simply a "composite slurry") was obtained containing the composite powder at the rate of 16 mass %.

3) The composite slurry thus obtained was subjected to thermogravimetric (TG) analysis. The weight was shown to decline between 250° C. and 600° C. This weight change is attributed to decomposition of the silicon-containing compound coating the surface of the titanium dioxide particles.

4) The aluminum powder and glass powder prepared above and the composite powder obtained in 1) above or the composite slurry obtained in 2) above were kneaded together with an organic vehicle composed of a binder (ethyl cellulose) and an organic solvent (terpineol) to obtain a paste composition. The compounded proportions of aluminum powder and glass powder in the resulting paste composition were adjusted to 70 mass % aluminum powder and 1 mass % glass powder given 100 mass % as the total of the paste composition. The compounded proportion of the composite powder, calculated as a percentage of the combined amount of composite powder, aluminum powder and glass powder (that is, the total solids), was adjusted to prepare 10 different paste compositions with different amounts of composite powder as a percentage of total solids. These paste compositions were Samples 1 to 10. Table 1 shows Samples 1 to 10 and the amounts of composite powder as a percentage of total solids, correlated with the average particle diameter (additive particle diameter) of the composite powder. In Table 1, the composite powder added to Samples 1 to 10 is indicated as "$TiO_2$—Si".

Samples 1 to 8 are paste compositions prepared using the aforementioned composite slurry. Samples 9 and 10 are paste compositions prepared using the composite powder as is, without preparing a composite slurry.

In these paste compositions (Samples 1 to 10), the percentage (compounded ratio) of liquid components is 100 mass % minus the percentage of solids (aluminum powder, glass powder and composite powder). Specifically, the liquid components comprise the aforementioned binder (1.5 mass % of the total paste composition), with the remainder being the organic solvent. In the paste compositions (Samples 1 to 8) prepared using the aforementioned composite slurries, the percentage content of the isobutyl trimethoxysilane and isopropyl alcohol in the slurry is included in the liquid component, and the liquid component minus these two components and the aforementioned binder is the percentage content (compounded ratio) of the aforementioned organic solvent in the paste composition.

Example 2

Preparation of Paste Compositions (2)

Next, four paste compositions with different compounded ratios of titanium dioxide powder were prepared by the paste composition preparation methods shown in Example 1 above using the same procedures except that the titanium dioxide powder obtained in 1) of (3) above was used in place of the aforementioned composite powders. These were Samples 12 to 15. Table 1 shows Samples 12 to 15 and the percentage (compounded ratio) of added titanium dioxide powder as a percentage of the solids (that is, the combined amount of aluminum powder, glass powder and titanium dioxide powder), correlated with the average particle diameter of the titanium dioxide powder.

A paste composition was also prepared by the same procedures except that no composite powder at all was added as an additive in the paste composition preparation method shown in Example 1 above. This paste composition was Sample 11.

Example 3

Preparation of Paste Compositions (3)

Next, three paste compositions with different compounded ratios of a composite powder composed of zinc oxide and a silicon-containing compound were prepared by the paste composition preparation method shown in Example 1 above, using the same procedures except that composite powder prepared using zinc oxide (ZnO) powder (average particle diameter 25 nm) was used instead of composite powder prepared using titanium dioxide as the metal oxide. These were Samples 16 to 18. Of these, Samples 16 and 17 were prepared by adding the composite powder as is in powder form. Sample 18 was prepared with the composite powder added in slurry form rather than powder form. The slurry preparation method was the same as in 2) of (3) of Example 1 above. Table 1 shows Samples 16 to 18 correlated with the compounded ratios (as a percentage of the solids) of the composite powder. In Table 1, the form of the compounded powder is shown as "ZnO—Si".

Two paste compositions with different compounded ratios of zinc oxide were also prepared in the same way as Samples 16 and 17, except that zinc oxide powder was added to prepare the paste composition rather than composite powder prepared using zinc oxide. These were Samples 19 and 20. Samples 19 and 20 were prepared with the zinc oxide added in powder rather than slurry form.

Example 4

Preparation of Paste Compositions (4)

A paste composition was prepared by the paste composition preparation methods shown in Example 1 above, using the same procedures except that composite powder prepared using silicon dioxide ($SiO_2$) powder (average particle diameter 25 nm) was used instead of composite powder prepared using titanium dioxide powder as the metal oxide. This was Sample 21. Sample 21 was prepared with the composite powder added in slurry rather than powder form. The slurry was prepared by the same preparation methods as in 2) of (3) of Example 1 above. In Table 1, the form of the composite powder is shown as "$SiO_2$—Si".

A paste composition was also prepared by the same procedures except that a composite powder prepared using zirconium oxide ($ZrO_2$) powder (average particle size 6 nm) was used instead of the composite powder prepared using silicon dioxide powder above. This was Sample 22. Sample 22 was also prepared with the composite powder added in slurry rather than powder form. The slurry was prepared by the same preparation methods as in 2) of (3) of Example 1 above. In Table 1, the form of the composite powder is shown as "$ZrO_2$—Si".

A paste composition was also prepared by the same procedures except that a composite powder prepared using aluminum oxide ($Al_2O_3$) powder (average particle diameter 30 nm) was used instead of the composite powder prepared using silicon dioxide powder above. This was Sample 23. Sample 23 was also prepared with the composite powder added in slurry rather than powder form. The slurry was prepared by the same preparation methods as in 2) of (3) of Example 1 above. In Table 1, the form of the composite powder is shown as "$Al_2O_3$—Si".

Example 5

Calculating Warpage

Solar cells were manufactured using the paste compositions of Samples 1 to 23 obtained above for forming the aluminum electrodes.

Specifically, commercial 125 mm square p-type single-crystal silicon substrates (200 μm thick) for solar cells were provided, and their surfaces alkali etched using an aqueous sodium hydroxide solution.

Next, a phosphorus-containing solution was coated on the light-receiving surface of the silicon substrates, which had a textured structure formed by the aforementioned etching treatment, and a roughly 0.5 μm thick n-Si layer ($n^+$ layer) was formed by heat treatment on the light-receiving surface of each silicon substrate (see FIG. 1).

Next, an antireflective film (titanium oxide film) with a thickness of at least 50 nm but no more than 100 nm was formed by plasma CVD (PECVD) on the n-Si layer. A film coat (thickness at least 20 μm but no more than 50 μm) for the front electrode (Ag electrode) was then formed by screen printing on the antireflective film using a specific silver paste for front electrode (Ag electrode) formation (see FIG. 1).

The paste compositions of Samples 1 to 23 were then printed (applied) by screening printing (here and below, using an SUS #165 stainless steel mesh) on the backs of the silicon substrates, forming coated films about 55 μm thick. Next, the silicon substrates were fired to form aluminum electrodes (back electrodes). Specifically, they were fired in atmosphere at a temperature of roughly 700° C. to 800° C. using an infrared high-speed firing furnace.

Next, the warpage of the fired silicon substrates was investigated. That is, the fired silicon substrates were set on a horizontal test bench with the side with the formed aluminum electrode facing up, and the distance between the lowest and highest part in the direction of thickness of the silicon substrate was measured. This measurement is given as the warpage (mm) for the test example. The results are shown in the corresponding column in Table 1.

Example 6

Appearance Evaluation of Aluminum Electrodes

After firing, the formed aluminum electrodes were also examined visually to see if there were any blisters and other blemishes on the surface. The results are shown in the corresponding column in Table 1. Samples with blemishes are marked as "Y".

As shown in Table 1, in Sample 11 with no additives added, warpage was 2.3 mm, and blemishes was found on the surface of the aluminum electrode formed using this Sample 11.

By contrast, in Samples 1 to 10 in which composite powder ($TiO_2$—Si) was added, there was less warpage of the substrate in all cases, and no blemishes appeared on the surface of the aluminum electrodes.

In the case of Samples 1 to 5 and 8 using composite slurries in which the composite powders had the same particle diameter, warpage of the substrate was lower the greater the amount of composite powder as a percentage of the solids. For example, in Sample 1 the percentage was 0.03 mass %, and warpage was reduced by 25% or more in comparison with Sample 11. Warpage was reduced by 30% or more using Samples 2 and 3, in which the percentage was at least 0.1 mass % but less than 0.3 mass %. Warpage was reduced by 40% or more using Samples 4, 5 and 8, in which the percentage was at least 0.3 mass % but less than 0.45 mass %.

In the case of Samples 5 to 7, in which the amount of composite powder as a percentage of the solids was the same but the average particle diameter of the composite powder was different, the amount of warpage was less the smaller the average particle diameter (that is, there was less warpage in Sample 5 than in Sample 6, and less in Sample 6 than in Sample 7).

In the case of Samples 5 and 9, the fact that there was less warpage of the substrate in Sample 5 was evidence that the composite powder was more effective at suppressing warpage of the substrate when added in slurry form than when added as a powder. This tendency is also shown from a comparison of Samples 8 and 10.

Furthermore, the amount of substrate warpage was less than in Sample 11 above in all of Samples 12 to 15, in which titanium dioxide ($TiO_2$) powder was added. However, blemishes were observed on the aluminum electrodes.

In the case of Samples 16 to 18 having added composite powder using zinc oxide (ZnO—Si), substrate warpage was sufficiently reduced whether the composite powder was used in powder or in slurry form. By contrast, in the case of Samples 19 and 20 having added zinc oxide powder, there was no great difference in the amount of warpage between Sample 11 above and Sample 19 having the smaller added amount (compounded proportion) of the zinc oxide powder. Substrate warpage was reduced using Sample 20 in which more powder was added, but comparing this Sample 20 with Sample 17 having the same added amount, warpage was less in Sample 17 using the composite powder, confirming that the composite powder was more effective at reducing warpage than the zinc oxide powder.

In the case of Samples 21, 22 and 23 using $SiO_2$—Si composite powder, $ZrO_2$—Si composite powder and $Al_2O_3$—Si composite powder, respectively, substrate warpage was lower in all cases than with Sample 11 above (especially in the case of Sample 22). In the case of Samples 21 and 22, blemishes appeared on the aluminum electrode using the sample.

Example 7

Measurement of Open Voltage

In this example, a silver paste for forming a back electrode (Ag electrode) similar to the silver paste for forming the aforementioned front electrodes (Ag electrodes) was screen printed in a specific pattern on the back of the silicon substrates with front electrodes (Ag electrodes) formed in Example 5 above, and dried to form back Ag coats 20 μm to 50 μm thick (that is, electrodes for back external connection made of Ag after firing; see FIG. 1).

Next, the paste compositions of Samples 1 to 23 were printed (applied) by screen printing to form coated films about 55 μm thick. These silicon substrates were then fired at 700° C. to 800° C. in atmosphere using an infrared high-speed firing furnace. Aluminum electrodes (back electrodes) were formed together with the front electrodes (Ag electrodes) and Ag electrodes for back external connection by means of this firing process.

Next, the resulting solar cells (see FIG. 1) were connected to voltage meters between the front and back Ag electrodes, and the open voltage (Voc) or in other words the maximum voltage with the light-receiving surface exposed to solar light was measured. The results are shown in the corresponding column in Table 1.

As shown in Table 1, open voltage was 610 mV in the case of a solar cell provided with an aluminum electrode using Sample 11, which had no additives added thereto.

In the case of Samples 1 to 7 and 9, the resulting solar cells exhibited good open voltage of 610 mV or more in all cases despite the addition of composite powder ($TiO_2$—Si), confirming that superior battery characteristics could be obtained. In the case of Samples 8 and 10 in which the composite powder was added at the rate of 0.5 mass % or more of the solids, the resulting solar cells all exhibited open voltage of 607 mV, or less than 610 mV.

In the case of Samples 12 to 15 having titanium dioxide powder added thereto, the open voltage of the resulting solar cells was less than 610 mV.

In the case of Samples 16 to 18 using composite powder (ZnO—Si), the resulting solar cells exhibited open voltage of 610 mV or more, confirming that excellent battery characteristics could be obtained even with composite powder (ZnO—Si) added. In the case of Samples 19 and 20 using zinc oxide powder, the open voltage of the resulting solar cells was less than 610 mV.

In the case of Samples 21, 22 and 23 using $SiO_2$—Si composite powder, $ZrO_2$-Si composite powder and $Al_2O_3$—Si composite powder, the open voltage of the resulting solar cells was less than 610 mV in all cases.

TABLE 1

| Sample | Additive | Additive/Solids [mass %] | Particle size of additive [nm] | Form | Warpage [mm] | Open voltage [mV] | Blemishes |
|---|---|---|---|---|---|---|---|
| 1 | $TiO_2$—Si | 0.03 | 6 | Slurry | 1.7 | 613 | |
| 2 | $TiO_2$—Si | 0.14 | 6 | Slurry | 1.4 | 614 | |
| 3 | $TiO_2$—Si | 0.28 | 6 | Slurry | 1.4 | 613 | |
| 4 | $TiO_2$—Si | 0.34 | 6 | Slurry | 1.3 | 613 | |
| 5 | $TiO_2$—Si | 0.42 | 6 | Slurry | 1.0 | 611 | |
| 6 | $TiO_2$—Si | 0.42 | 30 | Slurry | 1.2 | 612 | |
| 7 | $TiO_2$—Si | 0.42 | 70 | Slurry | 1.3 | 614 | |
| 8 | $TiO_2$—Si | 0.56 | 6 | Slurry | 0.4 | 607 | |
| 9 | $TiO_2$—Si | 0.42 | 6 | Powder | 1.5 | 610 | |
| 10 | $TiO_2$—Si | 0.56 | 6 | Powder | 1.4 | 607 | |
| 11 | — | 0 | — | — | 2.3 | 610 | Y |
| 12 | $TiO_2$ | 0.03 | 6 | Powder | 2.1 | 609 | Y |
| 13 | $TiO_2$ | 0.42 | 6 | Powder | 1.5 | 608 | Y |
| 14 | $TiO_2$ | 0.42 | 30 | Powder | 1.5 | 608 | Y |
| 15 | $TiO_2$ | 0.42 | 70 | Powder | 1.3 | 608 | Y |
| 16 | ZnO—Si | 0.14 | 25 | Powder | 1.5 | 612 | |
| 17 | ZnO—Si | 0.42 | 25 | Powder | 1.4 | 610 | |
| 18 | ZnO—Si | 0.42 | 25 | Slurry | 1.2 | 612 | |
| 19 | ZnO | 0.14 | 25 | Powder | 2.1 | 606 | Y |
| 20 | ZnO | 0.42 | 25 | Powder | 1.8 | 604 | |
| 21 | $SiO_2$—Si | 0.42 | 25 | Slurry | 1.4 | 607 | Y |
| 22 | $ZrO_2$—Si | 0.42 | 6 | Slurry | 0.4 | 602 | Y |
| 23 | $Al_2O_3$Si | 0.42 | 30 | Slurry | 1.2 | 605 | |

Consequently, it has been confirmed that the with the paste compositions of these examples, warpage of the substrate is reduced and such warpage is effectively controlled even when the silicon substrate is coated with the paste composition and fired if a composite powder composed of a metal oxide and a silicon-containing compound is contained in the amount of at least 0.01 mass % but less than 0.45 mass % of the solids, and blemishes on an aluminum electrode (back electrode) formed by such firing are also effectively suppressed. It has also been confirmed that even though the paste composition contains this composite compounded, the battery characteristics (open voltage Voc) of a solar cell equipped with such an aluminum electrode are still high (such as Voc 610 mV or more).

With the paste composition for forming a back electrode of the present invention, it is possible to prevent warpage of the substrate and provide a solar cell with excellent battery characteristics and a good external appearance.

What is claimed is:

1. A paste composition for forming a back electrode of a solar cell, comprising:
    an aluminum powder;
    a glass powder; and
    a composite powder composed of a particulate composite of a metal oxide with a silicon-containing organic or inorganic compound, such composite powder being present in an amount of at least 0.01 mass % but less than 0.45 mass % where 100 mass % is the total amount of the composite powder, the aluminum powder and the glass powder.

2. The paste composition according to claim 1, wherein at least part of the surface of the metal oxide is coated with the silicon-containing organic or inorganic compound.

3. The paste composition according to claim 1, wherein the metal oxide is a titanium or zinc oxide.

4. The paste composition according to claim 1, wherein an average particle diameter of the composite powder is at least 1 nm but no more than 100 nm.

5. The paste composition according to claim 1, wherein the solids are contained in an amount of at least 60 mass % but no more than 80 mass % of the paste composition as a whole including a liquid medium.

6. A method for manufacturing a paste composition for forming a back electrode of a solar cell, the method comprising:
    preparing, as solids, an aluminum powder, a glass powder and a composite powder composed of a particulate composite of a metal oxide with a silicon-containing organic or inorganic compound; and
    mixing the prepared powders with a liquid medium to prepare a paste;
    wherein the composite powder is mixed in an amount of at least 0.01 mass % but less than 0.45 mass % given 100 mass % as the total of the composite powder, the aluminum powder and the glass powder.

7. The manufacturing method according to claim 6, wherein the metal oxide at least part of the surface of which is coated with the silicon-containing organic or inorganic compound is used as the composite powder.

8. The manufacturing method according to claim 6, wherein a titanium or zinc oxide is used as the metal oxide.

9. The manufacturing method according to claim 6, wherein, when preparing the paste, the composite powder is provided in the form of a dispersion in which the powder is dispersed in advance in a specific liquid medium.

10. The manufacturing method according to claim 6, wherein a composite powder with an average particle diameter of at least 1 nm but no more than 100 nm is used as the composite powder.

11. A solar cell comprising a back electrode formed using the paste composition of claim 1.

* * * * *